US010085337B2

(12) United States Patent
Fisné et al.

(10) Patent No.: US 10,085,337 B2
(45) Date of Patent: Sep. 25, 2018

(54) COAXIAL CABLE ASSEMBLY, ELECTRONIC PACKAGE AND CONNECTOR

(71) Applicant: INSTITUT NATIONAL D'OPTIQUE, Québec (CA)

(72) Inventors: Christophe Fisné, Reims (FR); Alex Paquet, Québec (CA); Bruno Fisette, Saint-Augustin-de-Desmaures (CA)

(73) Assignee: INSTITUT NATIONAL D'OPTIQUE, Quebec (CA)

( * ) Notice: Subject to any disclaimer, the term of this patent is extended or adjusted under 35 U.S.C. 154(b) by 96 days.

(21) Appl. No.: 15/165,489

(22) Filed: May 26, 2016

(65) Prior Publication Data

US 2017/0347446 A1    Nov. 30, 2017

(51) Int. Cl.
| | |
|---|---|
| *H01P 5/08* | (2006.01) |
| *H05K 1/02* | (2006.01) |
| *H01P 3/08* | (2006.01) |
| *H01L 23/057* | (2006.01) |
| *H01L 23/66* | (2006.01) |
| *H01R 9/05* | (2006.01) |

(52) U.S. Cl.
CPC ......... *H05K 1/0243* (2013.01); *H01L 23/057* (2013.01); *H01L 23/66* (2013.01); *H01P 3/08* (2013.01); *H01P 5/08* (2013.01); *H01P 5/085* (2013.01); *H01R 9/0515* (2013.01); *H01L 2223/6627* (2013.01); *H01L 2223/6683* (2013.01); *H01L 2223/6694* (2013.01)

(58) Field of Classification Search
CPC .... H01P 3/08; H01P 3/081; H01P 5/08; H01P 5/085
USPC .............. 333/33, 34, 238, 245, 246, 260
See application file for complete search history.

(56) References Cited

U.S. PATENT DOCUMENTS

| | | | |
|---|---|---|---|
| 6,661,318 B2 * | 12/2003 | Tamaki | H01P 5/085 333/260 |
| 6,674,347 B1 * | 1/2004 | Maruhashi | H01P 3/003 333/161 |

(Continued)

OTHER PUBLICATIONS

Brock J. Lameres et al., Novel 3-D Coaxial Interconnect System for Use in System-in-Package Applications, IEEE Transactions on Advanced Packaging, Feb. 2010, pp. 37-47, vol. 33, No. 1, Montana.

*Primary Examiner* — Stephen E Jones
(74) *Attorney, Agent, or Firm* — Norton Rose Fulbright Canada LLP; Alexandre Daoust (57) ABSTRACT

The coaxial cable assembly generally has a coaxial cable; and a connector assembled to an end of the coaxial cable, the connector having a dielectric body having a connecting surface, a longitudinal groove recessed in the connecting surface and having a groove end spaced from an edge of the connecting surface, and a coplanar waveguide along the connecting surface, the coplanar waveguide having a signal conductor extending from the groove end to the edge and between ground conductors each extending from a respective lateral side of the longitudinal groove to the edge; the end of the coaxial cable being received in the longitudinal groove and having an inner conductor electrically connected to the signal conductor and an outer conductor electrically connected to the ground conductors in a manner allowing connection of the coaxial cable with another coplanar waveguide of an integrated circuit.

13 Claims, 6 Drawing Sheets

(56) References Cited

U.S. PATENT DOCUMENTS

| | | | | |
|---|---|---|---|---|
| 6,927,655 B2 * | 8/2005 | Torigoe | ............... | G02B 6/4201 333/260 |
| 2007/0126524 A1 * | 6/2007 | Yagisawa | ............. | H05K 1/0219 333/33 |

* cited by examiner

COAXIAL CABLE ASSEMBLY, ELECTRONIC PACKAGE AND CONNECTOR

FIELD

This disclosure relates to system-in-package applications and more particularly relates to system-in-package applications involving integrated circuits such as photonic integrated circuits and/or electronic integrated circuits.

BACKGROUND

System-in-a-package (SiP) devices generally involve a number of integrated circuits enclosed in an electronic package.

In some applications, it can be desired to connect electrical signal carriers to an integrated circuit. For instance, an electrical signal can be sent from one integrated circuit to another via a technique known as wire bonding, which requires soldering wires to the integrated circuits.

Although existing wire bonding techniques are satisfactory to a certain degree, there remains room for improvement, such as in radiofrequency/microwave applications in which wire bonding leads to undesirable signal losses.

SUMMARY

There is provided a connector which can be made integral to an end of a coaxial cable and can be used to connect the coaxial cable to an integrated circuit in a flip-chip connection.

In accordance with one aspect, there is provided a coaxial cable assembly comprising: at least one coaxial cable, each coaxial cable having an end for connection to an integrated circuit; and a connector assembled to the end of each of the at least one coaxial cable, the connector having a dielectric body having a connecting surface, at least one longitudinal groove recessed in the connecting surface and having a groove end spaced from an edge of the connecting surface, and a coplanar waveguide extending at least partially along the connecting surface up to the edge, the coplanar waveguide having at least one signal conductor positioned between and separated from ground conductors; each end of the at least one coaxial cable being received in the at least one longitudinal groove, each end having an inner conductor electrically connected to a corresponding one of the at least one signal conductor and an outer conductor electrically connected to the ground conductors, the coplanar waveguide being connectable to another coplanar waveguide of the integrated circuit.

In accordance with another aspect, there is provided an electronic package comprising: a housing; an integrated circuit enclosed in the housing and having a substrate and a first coplanar waveguide on a surface of the substrate; at least one coaxial cable each having an end exposing an outer conductor and an inner conductor for connection to the integrated circuit; and a connector assembled to the end of each coaxial cable, the connector having a dielectric body having a connecting surface, at least one longitudinal groove recessed in the connecting surface and having a groove end spaced from an edge of the connecting surface, and a second coplanar waveguide along the connecting surface, the second coplanar waveguide having at least one signal conductor extending from each groove end to the edge and ground conductors each extending from a respective lateral side of the at least one longitudinal groove to the edge, the at least one signal conductor extending between the ground conductors; the end of each of the at least one coaxial cable being received in the at least one longitudinal groove, the inner conductor of each of the at least one coaxial cable being electrically connected to a corresponding one of the at least one signal conductor, the outer conductor being electrically connected to the ground conductors, the first coplanar waveguide being connected to the second coplanar waveguide in a manner allowing waveguiding of a radiofrequency/microwave signal back and forth between the at least one coaxial cable and the first coplanar waveguide via the second coplanar waveguide.

In accordance with another aspect, there is provided a connector for use in connecting at least one coaxial cable to an integrated circuit, the connector comprising a dielectric body having a connecting surface, at least one longitudinal groove recessed in the connecting surface and having a groove end spaced from an edge of the connecting surface, and a coplanar waveguide having at least one signal conductor extending from the groove end to the edge and ground conductors each extending from a respective lateral side of the at least one longitudinal groove to the edge, the at least one signal conductor extending between and separated from the ground conductors; wherein, during use, each end of the at least one coaxial cable is received in the at least one longitudinal groove, each end of the at least one coaxial cable having an inner conductor being electrically connected to a corresponding one of the at least one signal conductor and an outer conductor being electrically connected to the ground conductors, and the coplanar waveguide of the connector being connected to another coplanar waveguide of the integrated circuit.

It was found that use of the connector can avoid a step of machining and/or etching a groove on the substrate of the integrated circuit. The connector can be designed so as to fit with any integrated circuit and any pad configuration thereof. In some embodiments, the connector may have a low insertion loss (e.g. below 0.4 dB inside the electronic package) and may be operated with high-bandwidth signals (e.g. from DC to 50 GHz).

Many further features and combinations thereof concerning the present improvements will appear to those skilled in the art following a reading of the instant disclosure.

DESCRIPTION OF THE FIGURES

In the figures.

DETAILED DESCRIPTION

Figure 1:
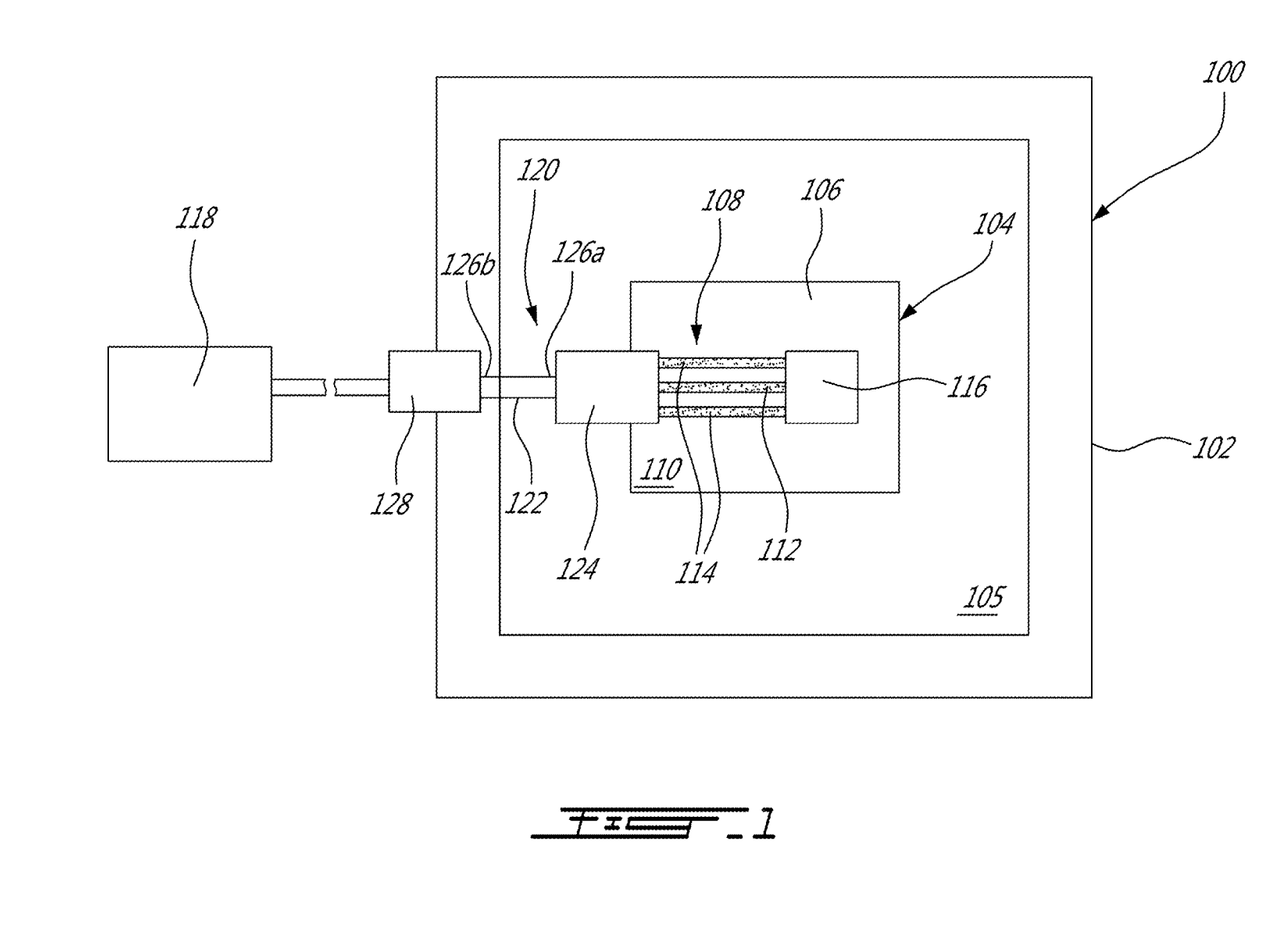
FIG. 1 is a schematic top view of an example of an electronic package including an integrated circuit and a coaxial cable assembly.

FIG. 1 is a schematic top view of an example of an electronic package 100 having a housing 102 enclosing an integrated circuit 104 (e.g., a photonic integrated circuit and/or an electronic integrated circuit). In this example, the integrated circuit 104 may be disposed on a printed circuit board (PCB) 105.

As depicted in this embodiment, the integrated circuit 104 has a substrate 106 and a first coplanar waveguide 108 on a surface 110 of the substrate 106. The first coplanar waveguide 108 has a signal conductor 112 and two ground conductors 114 extending along either side of the signal conductor 112.

As it will be understood, the first coplanar waveguide 108 is configured and adapted to guide a radiofrequency/microwave (RF/MW) signal either from or towards one or more devices 116 of the integrated circuit 104. The RF/MW signal can be communicated between the integrated circuit 104 and an external device 118 (e.g., a radio (transmitter and/or receiver), a computer, a signal processor, a detector or a modulator via at least a coaxial cable assembly 120.

The coaxial cable assembly 120 includes a coaxial cable 122 and a connector 124 assembled to an end 126a of the coaxial cable 122. As it will be described below, the connector 124 is used to electrically connect the end 126a of the coaxial cable 122 to the first coplanar waveguide 108 of the integrated circuit 104.

In this illustrated example, the coaxial cable 122 has another end 126b, opposite to the end 126a, which has a connector 128 mounted on the housing 102 of the electronic package 100. The external connector 128 can be provided in the form of a coaxial connector, a GPPO connector, a series of pins, a grid array, or any other suitable type of connector.

In another embodiment, two integrated circuits enclosed in a single electronic package can be connected together using a coaxial cable assembly having connectors at both ends. In an alternate embodiment, two integrated circuits enclosed in two distinct electronic packages can be connected together using a coaxial cable assembly having connectors at both ends. Other types of electronic packages can be provided.

Figure 2:
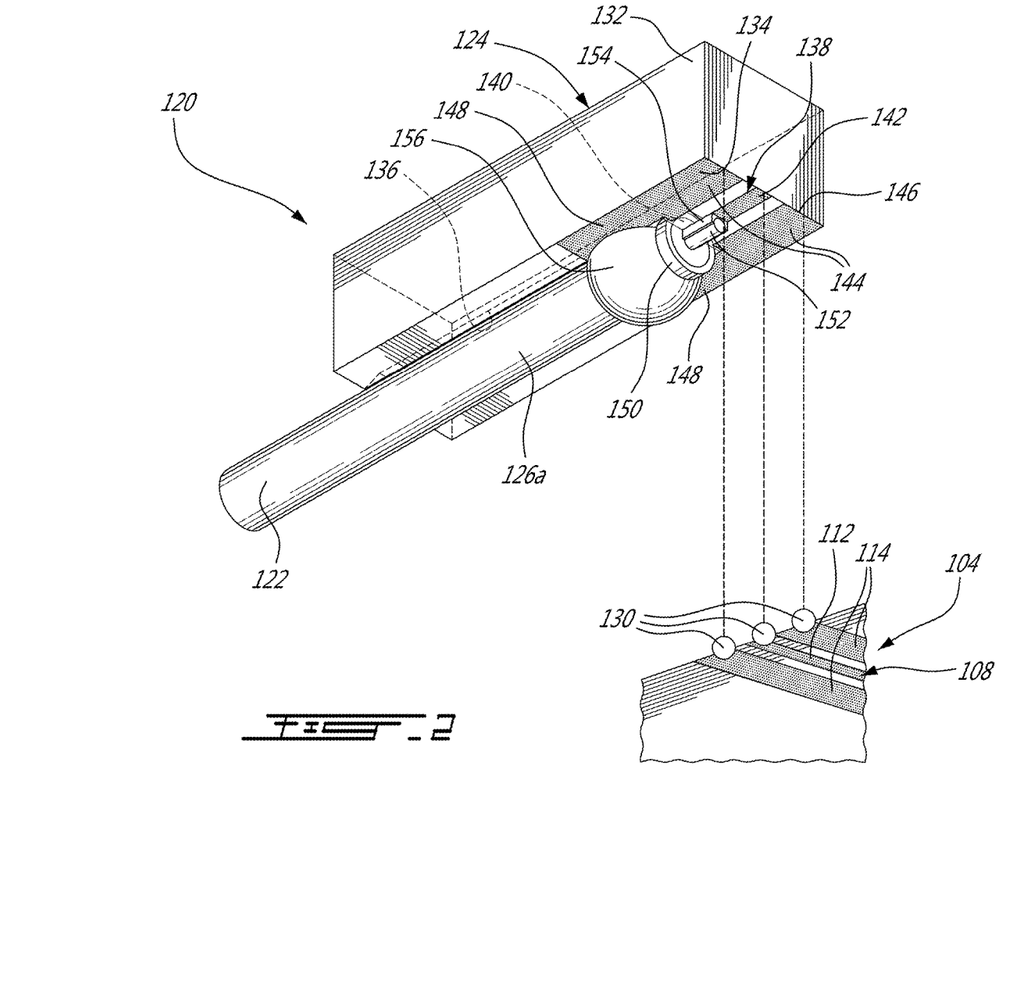
FIG. 2 is an exploded view of an example embodiment of a coaxial cable assembly of FIG. 1.

FIG. 2 shows an exploded view of the coaxial cable assembly 120 placed above and in vertical alignment with the end portion of the first coplanar waveguide 108 of the integrated circuit 104. As depicted, the end 126a of the coaxial cable 122 is assembled to the connector 124.

As depicted, the connector 124 has a dielectric body 132 having a connecting surface 134. The dielectric body 132 has a longitudinal groove 136 which is recessed in the connecting surface 134 and which extends along a portion of the connecting surface 134 to terminate at an end 140 of the longitudinal groove (referred to as "the groove end 140") spaced from an edge 146 of the connecting surface 134. The dielectric body 132 has a second coplanar waveguide 138 having a signal conductor 142 extending from the groove end 140 up to the edge 146 and two ground conductors 144 each located on a respective lateral side 148 of the longitudinal groove 136 and extending up to the edge 146 of the connecting surface 134. As shown, the signal conductor 142 is located between the two ground conductors 144. The longitudinal groove can be etched (e.g., KOH wet etched on silicon) or machined in the dielectric body 132.

As it will be understood, the second coplanar waveguide 138 is designed such as to match the impedance between the coaxial cable 122 and the first coplanar waveguide 108 of the integrated circuit 104. In other words, the second coplanar waveguide 138 is designed to limit reflection and/or radiation of the RF/MW signal along the connector during use thereof.

As shown, the end 126a of the coaxial cable 122 has an outer conductor 150 and an inner conductor 152 protruding from the unstripped portion of the cable 122. As shown in this example, the outer conductor 150 is received in the longitudinal groove 136 in a manner that the inner conductor 152 protrudes from the groove end 140, e.g., over a length of about 1 mm. An adhesive can be used to adhere the end 126a, or more specifically the outer conductor 150, to the longitudinal groove 136. The adhesive is optional. In this example, the adhesive is heat-resistant. Still alternately, in other embodiments, the electrical connection function and the mechanical connection function can be partially or fully dissociated. For instance, an adhesive (electrically conductive or not) can be used in addition to soldering in order to strengthen the intrinsic mechanical bond of the soldering. In another example, ductile stud bumps can be compressed to perform the electrical connection function, and an adhesive or a solder can be used to perform a mechanical connection function.

The protruding inner conductor 152 is electrically connected to the signal conductor 142, and the outer conductor 150 is electrically connected to the two ground conductors 144. In this case, the inner conductor 152 is soldered to the signal conductor 142 via a first solder joint 154, and the outer conductor 150 is soldered to the two ground conductors 144 via a second solder joint 156. An electrically conductive adhesive can be used to electrically connect the conductors of the coaxial cable 122 to corresponding conductors of the second coplanar waveguide 138.

Figure 3:
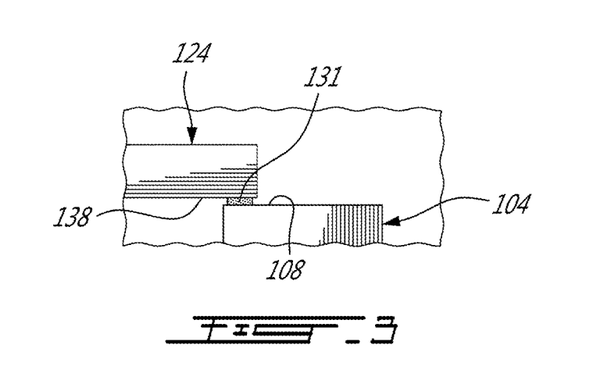
FIG. 3 is a partial side elevation view of another example of a connector shown connected to an integrated circuit.

As shown in this example, the second coplanar waveguide 138 has a waveguide end, proximate to the edge 146 of the connecting surface 134, that is connectable to the first coplanar waveguide 108 of the integrated circuit 104. As it will be understood, the second coplanar waveguide 138 of the connector 124 can be connected to the first coplanar waveguide 108 of the integrated circuit 104 via an electrical connection using solder bumps 130 such as shown in FIG. 2 or using an electrically conductive adhesive 131 such as shown in FIG. 3. It will be understood that the manner the solder bumps 130 shown in the example of FIG. 2 are used is analogous to that encountered in conventional flip-chip bonding techniques.

When the coaxial cable assembly 120 is connected to the integrated circuit 104, the signal conductor 112 of the first coplanar waveguide 108 is soldered to the signal conductor 142 of the second coplanar waveguide 138 using a solder bump 130, and each of the two ground conductors 114 of the first coplanar waveguide 108 is soldered to a respective one of the two ground conductors 144 of the second coplanar waveguide 138 using respective solder bumps 130.

As it will be understood, in another embodiment, the second coplanar waveguide of the connector can be connected to the first coplanar waveguide of the integrated circuit 104 via an electromagnetic connector (that will be referred to as "electromagnetic coupling") when using a dielectric spacer (e.g., dielectric adhesive, dielectric layer, air gap) between the two coplanar waveguides. When such a dielectric spacer is used, the second coplanar waveguide can be said to be electromagnetically coupled to the first coplanar waveguide and be applicable in the low frequency range, for instance.

Figure 4:
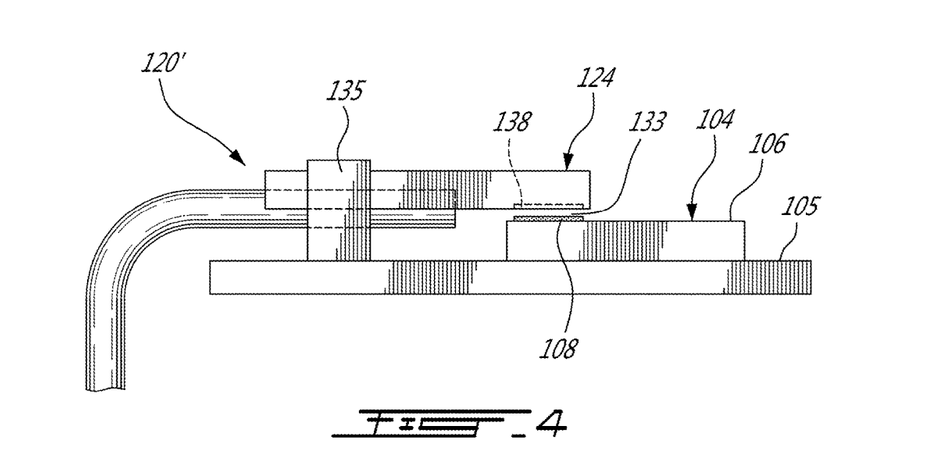
FIG. 4 is a side elevation view of an example of a coaxial cable assembly electromagnetically coupled to an integrated circuit via a dielectric spacer including an air gap.

FIG. 4 shows an example of a coaxial cable assembly 120' where a dielectric spacer 133 including an air gap is provided between the first coplanar waveguide 108 of the integrated circuit 104 and the second coplanar waveguide 138 of the connector 124. The integrated circuit 104 is disposed on the PCB 105. As depicted in this example, the connector 124 is mounted on the PCB 105 via a support structure 135 which maintains the second coplanar waveguide 138 vertically spaced from the first coplanar waveguide 108 by the dielectric spacer 133 while maintaining the waveguides 108 and 138 in proper vertical alignment. As it will be understood, the dielectric spacer 133 allows waveguiding of a radiofrequency/microwave signal back and forth between the first coplanar waveguide 108 and the second coplanar waveguide 138.

Figure 5:
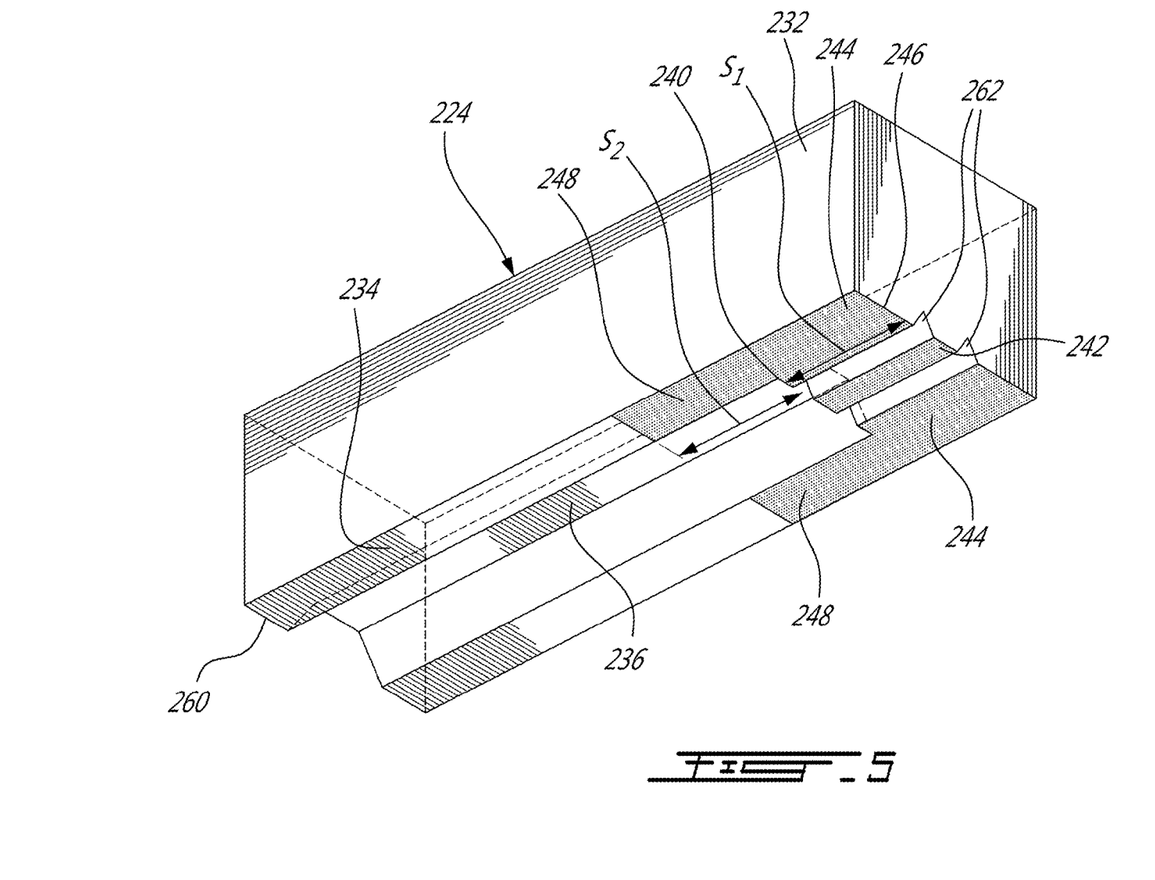
FIG. 5 is an oblique view, taken from below, of an example of a connector.

FIG. 5 is an oblique view taken from below of another example of a connector 224. The connector 224 is described such that like elements bear like reference numerals, but in the 200-series instead of the 100-series.

The connecting surface 234 has a first edge 260 and a second edge 246 opposite to the first edge 260. The longitudinal groove 236 extends from the first edge 260 along a portion of the connecting surface 234 up to the groove end 240, thus leaving a first spacing distance s1 between the groove end 240 and the second edge 246. The signal conductor 242 extends along the first spacing distance s1, from the groove end 240 up to the second edge 246. As shown, the first spacing distance s1 is long enough to allow the signal conductor 242 to be connectable to the inner conductor of the coaxial cable and to the signal conductor of the integrated circuit.

Each of the two ground conductors 244 extends from a respective lateral side 248 of the longitudinal groove 236 up to the second edge 246. More specifically, the ground conductors 244 extend only along a given portion of the lateral sides 248 of the longitudinal groove 236. The ground conductors 244 thus extend forwardly from the groove end 240 along the first spacing distance s1 and rearwardly from the groove end 240 along a second spacing distance s2. The second spacing distance s2 is long enough to allow the two ground conductors 244 to be connectable to the outer conductor of the coaxial cable. In this example, the conductors 242 and 244 are adapted to be connected to 100-μm pads of the integrated circuit.

In this embodiment, the longitudinal groove 236 is a truncated V-groove. However, any other suitable longitudinal groove can be used. For instance, a V-groove, a U-groove or any other equivalent structure can be used to secure the corresponding end of the coaxial cable.

Still referring to the embodiment of FIG. 5, the dielectric body 232 has a longitudinal recess 262 formed in the connecting surface 234 on either side of the signal conductor 242. Each longitudinal recess 262 has a V-shaped cross-section in this example, but other types of recess can be used as well.

In the illustrated example, the dielectric body 232 has a rectangular prism shape, and the connecting surface 234 is rectangular. However, it is noted that the body can have any other suitable shape, e.g., any parallelepipedic shape or any prismatic shape.

Figure 6:
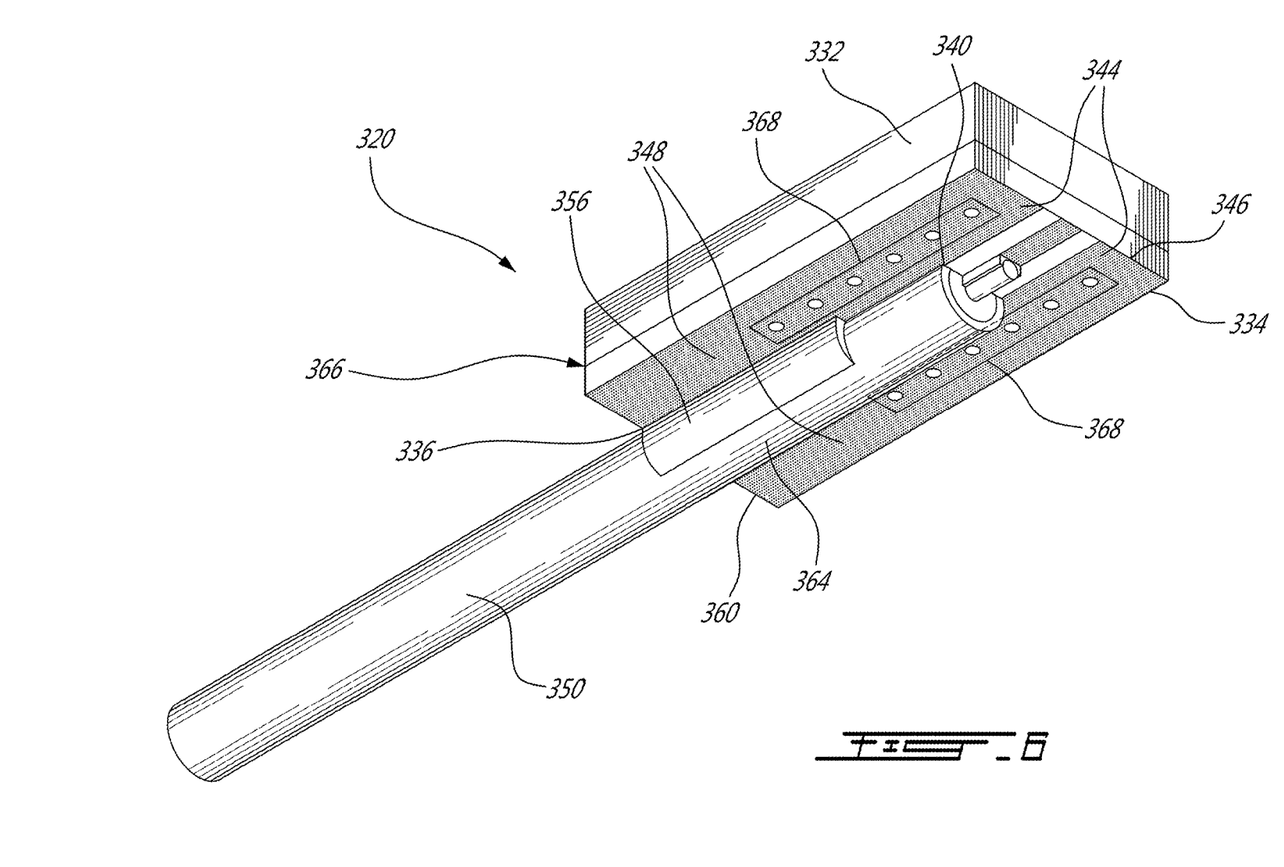
FIG. 6 is an oblique view, taken from below, of another example of a coaxial cable assembly including a coaxial cable and a connector having via fences.

FIG. 6 is another example of a coaxial cable assembly 320. The coaxial cable assembly 320 is described such that like elements bear like reference numerals, but in the 300-series instead of the 100-series.

As depicted, the two ground conductors 344 extend along the entire length of the connecting surface 334, along each lateral side 348 of the longitudinal groove 336 and from the first edge 360 to the second edge 346. In this example, a portion 364 of the outer conductor 350 is soldered to the two ground conductors 344 using a second solder joint 356. As it can be seen, the second solder joint 356 is elongated in this example.

Moreover, the dielectric body 332 has an inner conductive layer 366 spaced from and parallel to the connecting surface 334. In this embodiment, the inner conductive layer 366 and the two ground conductors 344 are electrically connected through two via fences 368. The inner conductive layer 366 can improve the electrical isolation of the propagation of the RF/MW signal. The via fences 368 can improve the propagation of the RF/MW signal. Each via fence 368 extends along a respective ground conductor 344, from a portion of the second solder joint 356 up to the second edge 346. The via fences 368 can help to guide the RF/MW signal from the coaxial cable to the integrated circuit.

In the examples described above, the connector has a longitudinal groove adapted for receiving an end of a single coaxial cable. In another embodiment, the connector has a single longitudinal groove adapted for receiving two or more adjacent ends of two or more corresponding coaxial cables. In an alternate embodiment, the connector has two or more spaced-apart longitudinal grooves, each being adapted to receive a respective end of a respective coaxial cable. When the connector is configured to receive two or more ends, the coplanar waveguide of such connector has a signal conductor for each end.

Figure 7:
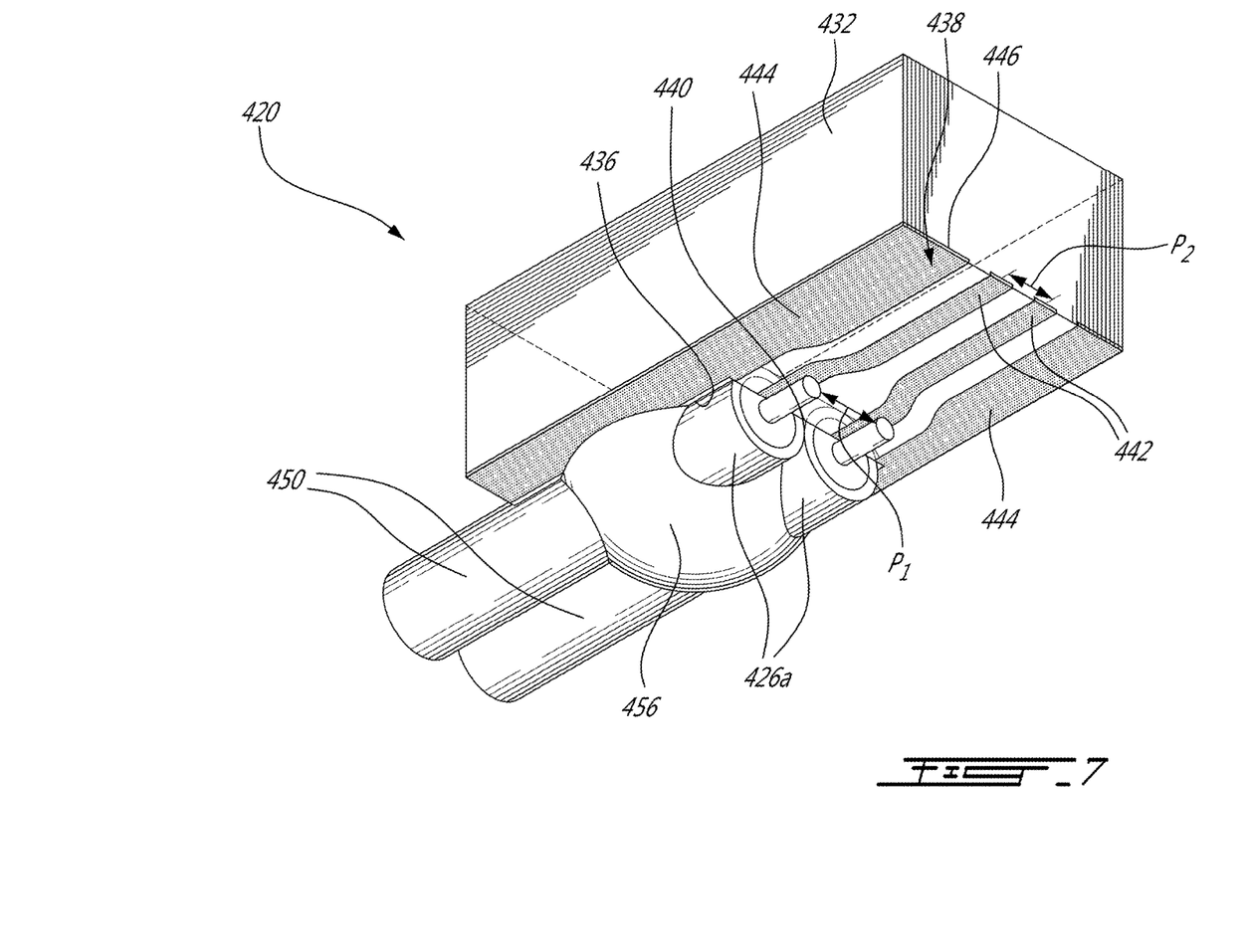
FIG. 7 is an oblique view, taken from below, of another example of a coaxial cable assembly including two coaxial cables and a connector adapted to receive each end of the two coaxial cables.

FIG. 7 shows another example of a coaxial cable assembly 420. The coaxial cable assembly 420 is described such that like elements bear like reference numerals, but in the 400-series instead of the 100-series.

As it can be seen, the coaxial cable assembly 420 has a longitudinal groove 436 which is sized and shaped to receive two adjacent ends 426a. The second coplanar waveguide 438 is adapted such that each end 426a has its respective signal conductor 442. The second coplanar waveguide 438 thus has two signal conductors 442 and two ground conductors 444. Both coaxial cables have signal conductors connected to respective signal conductors of the coplanar waveguide, whereas the outer conductors 450 of the coaxial cables both connect to the same two ground conductors 444.

In this embodiment, the outer conductors 450 of the coaxial cables are both connected to the two ground conductors 444 via the solder joint 456.

As it can be seen, the two adjacent ends 426a of the coaxial cables are spaced from one another by a first pitch $p_1$. Therefore, the two signal conductors 442 are spaced from one another by the first pitch $p_1$ proximate to the groove end 440. In this embodiment, the coaxial cable assembly 420 is adapted for connection to a first coplanar waveguide of an integrated circuit characterized by a second pitch $p_2$, smaller than the first pitch $p_1$. In this case, the second coplanar waveguide 438 is adapted to reduce the first pitch $p_1$ to the second pitch $p_2$ along its length. The two signal conductors 442 each have a curved portion curving towards one another so that proximate to the edge 446, the two signal conductors 442 are spaced from one another by the second pitch $p_2$. In an alternate embodiment, the second coplanar waveguide is adapted such that the pitch increases along the path from the groove end 440 up to the edge 446 of the connecting surface.

The connectors shown in FIGS. 2, 5 and 6 can be characterized by having a Ground-Signal-Ground (GSG) conductor configuration, and the connector shown in FIG. 7 can be characterized by having a Ground-Signal-Signal-Ground (GSSG) conductor configuration. As it will be understood, other embodiments of the connector can have different conductor configurations such as a GSGSG conductor configuration (with a common center ground conductor located between two adjacent signal conductors) or any other suitable conductor configuration. It is noted that the conductor configuration can be adapted to any conductor configuration of the coplanar waveguide of the integrated circuit, and to any pads thereof.

It is contemplated that, in some embodiments, the connector has one, two or more longitudinal groove(s), and that each longitudinal groove of such a connector is sized and shaped to receive one, two or more end(s) of corresponding coaxial cable(s).

The dielectric body of the connector can be wholly made or partially made of a dielectric material. For instance, the electrical insulator can include silicon, alumina ($Al_2O_3$), nitride of aluminum (AlN), quartz ($SiO_2$), ceramic (HTCC, LTCC) and/or any other suitable electrical insulator material. Preferably, the electrical insulator is heat-resistant so that a soldering step performed on the second coplanar waveguide causes minimal or no damage to the body. The body can have a parallelepipedic shape. Any other suitable shape can also be used.

In an embodiment, the coaxial cable is a Micro-coax® model "UT-013" cable having an outer conductor with a diameter of 330 µm and an inner conductor with a diameter of 78.7 µm. Other examples of coaxial cables include the Micro-coax® model "UT-020" or "UT-047" and the Pasternack® model "PE-020SR". Any suitable type of coaxial cable can be used.

A method of manufacturing a connector is provided. For instance, the method of manufacturing has a step of providing a dielectric body having a connecting surface. The method has a step of making at least one longitudinal groove along a portion of the connecting surface such as to define a groove end spaced from an edge of the connecting surface. The step of making can include machining the at least one longitudinal groove into the connecting surface and/or etching the at least one longitudinal groove into the connecting surface. The method has a step of providing a coplanar waveguide having a signal conductor extending from the groove end up to the edge of the connecting surface and two ground conductors, on either side of the signal conductor, from each lateral side of the longitudinal groove up to the edge of the connecting surface. The step of providing the coplanar waveguide can include metalizing the connecting surface along three spaced apart paths to form the signal and ground conductors. As it will be understood, many connectors can be manufactured on a single wafer. In this case, dicing can be required to obtain individual connectors from a single wafer.

A method of assembling a coaxial cable to a connector to provide a coaxial cable assembly is provided. For instance, the method of assembling includes a step of stripping an end of the coaxial cable such that the inner conductor is exposed over a given length. The method includes a step of providing the end of the coaxial cable into the longitudinal groove of the connector, with the end of the coaxial cable abutted on the groove end. The step of providing can include adhering the end of the coaxial cable to the longitudinal groove. The method has a step of electrically connecting both conductors of the coaxial cable to the conductors of the coplanar waveguide of the connector. More specifically, the step of electrically connecting includes connecting the inner conductor of the coaxial cable to the signal conductor of the coplanar waveguide and connecting the outer conductor of the coaxial cable to the two ground conductors of the coplanar waveguide of the connector. The step of electrically connecting can include soldering and/or adhering using an electrically conductive adhesive.

A method of connecting a coaxial cable assembly to an integrated circuit is provided. For instance, the method of connecting includes connecting the conductors of the coplanar waveguide of the connector to the corresponding conductors of the coplanar waveguide of the integrated circuit. The step of connecting can include electrically connecting via soldering (e.g., using solder balls, another form of flip-chip bonding such as ductile stud bumps) and/or via an adhesive. The step of connecting can also include electromagnetically coupling (or coupling) via a dielectric spacer (e.g., using a dielectric adhesive or an air gap). In still other embodiments, the connector structures can be used to connect two coaxial cables to one another.

As can be understood, the examples described above and illustrated are intended to be exemplary only. The scope is indicated by the appended claims.

What is claimed is:

1. A coaxial cable assembly comprising:
   at least one coaxial cable, each coaxial cable having an end for connection to an integrated circuit; and
   a connector assembled to the end of each of the at least one coaxial cable, the connector having a dielectric body having a connecting surface, at least one longitudinal groove recessed in the connecting surface and having a groove end spaced from an edge of the connecting surface, and a coplanar waveguide extending at least partially along the connecting surface up to the edge, the coplanar waveguide having at least one signal conductor positioned between and separated from ground conductors each extending from a respective lateral side of the at least one longitudinal groove to the edge, the dielectric body having an inner conductive layer extending parallel to the connecting surface, the coplanar waveguide including via fences each extending along a respective one of the ground conductors, at least a portion of each via fence running along and beside a corresponding portion of the longitudinal groove, each via fence electrically connecting the corresponding ground conductor to the inner conductive layer;
   each end of the at least one coaxial cable being directly received in the at least one longitudinal groove, each end having an inner conductor electrically connected to a corresponding one of the at least one signal conductor and an outer conductor electrically connected to the ground conductors, the coplanar waveguide being connectable to another coplanar waveguide of the integrated circuit.

2. The coaxial cable assembly of claim 1 wherein the outer conductor of the end of each of the at least one coaxial cable is adhered to the at least one longitudinal groove.

3. The coaxial cable assembly of claim 1 wherein the inner conductor of the end of each of the at least one coaxial cable protrudes from the groove end and is in contact with the corresponding one of the at least one signal conductor of the coplanar waveguide.

4. The coaxial cable assembly of claim 1 wherein ends of the signal and ground conductors of the coplanar waveguide each has a solder bump soldered thereto for a flip chip connection with corresponding ends of the other coplanar waveguide of the integrated circuit.

5. The coaxial cable assembly of claim 1 wherein the outer conductor of each end of the at least one coaxial cable is electrically connected to the ground conductors via soldering and the inner conductor of each end of the at least one coaxial cable is electrically connected to a corresponding one of the at least one signal conductor via soldering.

6. An electronic package comprising:
   a housing;

an integrated circuit enclosed in the housing and having a substrate and a first coplanar waveguide on a surface of the substrate;

at least one coaxial cable each having an end exposing an outer conductor and an inner conductor for connection to the integrated circuit; and a connector assembled to the end of each coaxial cable, the connector having a dielectric body having a connecting surface, at least one longitudinal groove recessed in the connecting surface and having a groove end spaced from an edge of the connecting surface, and a second coplanar waveguide along the connecting surface, the second coplanar waveguide having at least one signal conductor extending from each groove end to the edge and ground conductors each extending from a respective lateral side of the at least one longitudinal groove to the edge, the at least one signal conductor extending between the ground conductors, the dielectric body having an inner conductive layer extending parallel to the connecting surface, the second coplanar waveguide including via fences each extending along a respective one of the ground conductors, at least a portion of each via fence running along and beside a corresponding portion of the longitudinal groove, each via fence electrically connecting the corresponding ground conductor to the inner conductive layer;

the end of each of the at least one coaxial cable being directly received in the at least one longitudinal groove, the inner conductor of each of the at least one coaxial cable being electrically connected to a corresponding one of the at least one signal conductor, the outer conductor being electrically connected to the ground conductors, the first coplanar waveguide being connected to the second coplanar waveguide in a manner allowing waveguiding of a radiofrequency/microwave signal back and forth between the at least one coaxial cable and the first coplanar waveguide via the second coplanar waveguide.

7. The electronic package of claim 6 wherein the integrated circuit is a photonic integrated circuit.

8. The electronic package of claim 6 wherein another end of each of the at least one coaxial cable is mounted on the housing of the electronic package.

9. The electronic package of claim 6 wherein the first coplanar waveguide is electrically connected to the second coplanar waveguide.

10. The electronic package of claim 9 wherein the at least one signal conductor of the second coplanar waveguide is soldered to a corresponding signal conductor of the first coplanar waveguide and the ground conductors of the second coplanar waveguide are soldered to corresponding ground conductors of the first coplanar waveguide.

11. The electronic package of claim 6 wherein the first coplanar waveguide is electromagnetically coupled to the second coplanar waveguide.

12. The electronic package of claim 11 wherein the body of the connector is mounted on a printed circuit board via a support structure maintaining the second coplanar waveguide spaced from the first coplanar waveguide by a dielectric spacer, the dielectric spacer allowing waveguiding of the radiofrequency/microwave signal back and forth between the first coplanar waveguide and the second coplanar waveguide.

13. A connector for use in connecting at least one coaxial cable to an integrated circuit, the connector comprising a dielectric body having a connecting surface, at least one longitudinal groove recessed in the connecting surface and having a groove end spaced from an edge of the connecting surface, and a coplanar waveguide having at least one signal conductor extending from the groove end to the edge and ground conductors each extending from a respective lateral side of the at least one longitudinal groove to the edge, the at least one signal conductor extending between and separated from the ground conductors, the dielectric body having an inner conductive layer extending parallel to the connecting surface, the coplanar waveguide including via fences each extending along a respective one of the ground conductors, at least a portion of each via fence running along and beside a corresponding portion of the longitudinal groove, each via fence electrically connecting the corresponding ground conductor to the inner conductive layer; wherein, during use, each end of the at least one coaxial cable is directly received in the at least one longitudinal groove, each end of the at least one coaxial cable having an inner conductor being electrically connected to a corresponding one of the at least one signal conductor and an outer conductor being electrically connected to the ground conductors, and the coplanar waveguide of the connector being connected to another coplanar waveguide of the integrated circuit.

* * * * *